(12) United States Patent
Dehkordi et al.

(10) Patent No.: US 9,330,220 B1
(45) Date of Patent: May 3, 2016

(54) CLOCK REGION PARTITIONING AND CLOCK ROUTING

(71) Applicant: Xilinx, Inc., San Jose, CA (US)

(72) Inventors: Mehrdad E. Dehkordi, San Jose, CA (US); Marvin Tom, Cupertino, CA (US); Sridhar Krishnamurthy, San Jose, CA (US); Abhishek Joshi, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/467,908

(22) Filed: Aug. 25, 2014

(51) Int. Cl.
*G06F 17/50* (2006.01)
*G06F 1/10* (2006.01)

(52) U.S. Cl.
CPC ........ *G06F 17/5072* (2013.01); *G06F 17/5077* (2013.01); *G06F 1/10* (2013.01); *G06F 17/5027* (2013.01); *G06F 2217/62* (2013.01)

(58) Field of Classification Search
CPC ... G06F 2217/62; G06F 1/10; G06F 17/5027; G06F 13/4273; G06F 17/5077; H04L 7/0037
USPC ......... 716/105, 106, 110, 113, 114, 122, 124, 716/132, 134
See application file for complete search history.

(56) References Cited

U.S. PATENT DOCUMENTS

| | | | | |
|---|---|---|---|---|
| 5,835,751 A * | 11/1998 | Chen | ...... | A21B 1/245 327/39 |
| 6,998,876 B1 * | 2/2006 | Conn | ...... | G06F 1/10 326/101 |
| 7,546,567 B2 * | 6/2009 | Cheon | ...... | G06F 17/5077 716/113 |
| 7,752,588 B2 * | 7/2010 | Bose | ...... | G06F 17/5072 716/122 |
| 7,913,104 B1 * | 3/2011 | Cory | ...... | G06F 1/10 713/400 |
| 7,921,393 B2 * | 4/2011 | Furnish | ...... | G06F 17/5068 716/110 |
| 7,978,802 B1 * | 7/2011 | Raha | ...... | H03L 7/07 375/371 |
| 8,302,053 B2 * | 10/2012 | Siddiqui | ...... | G06F 17/5068 716/113 |
| 8,411,703 B1 * | 4/2013 | Cory | ...... | G06F 1/10 326/93 |
| 8,629,548 B1 * | 1/2014 | Andreev | ...... | G06F 1/10 257/691 |
| 8,937,491 B2 * | 1/2015 | Gaide | ...... | G06F 1/10 326/101 |
| 8,966,425 B1 * | 2/2015 | Eisenstadt | ...... | G06F 17/5031 716/120 |
| 9,009,645 B2 * | 4/2015 | Cao | ...... | G06F 17/5077 716/115 |
| 9,053,281 B2 * | 6/2015 | Ma | ...... | G06F 17/5077 |
| 9,135,386 B2 * | 9/2015 | Cao | ...... | G06F 1/10 |
| 2009/0217225 A1 * | 8/2009 | Sunder | ...... | G06F 1/10 716/113 |
| 2010/0090738 A1 * | 4/2010 | Changchein | ...... | H03K 19/00323 327/170 |
| 2013/0285739 A1 * | 10/2013 | Blaquière | ...... | G01R 31/318555 327/565 |
| 2014/0132305 A1 * | 5/2014 | Gaide | ...... | G06F 1/10 326/93 |
| 2014/0289685 A1 * | 9/2014 | Ma | ...... | G06F 17/505 716/102 |
| 2014/0289690 A1 * | 9/2014 | Chopra | ...... | G06F 17/5077 716/113 |

\* cited by examiner

*Primary Examiner* — Helen Rossoshek
(74) *Attorney, Agent, or Firm* — Kevin T. Cuenot

(57) ABSTRACT

Clock region partitioning and clock routing includes creating partitions for a plurality of clocks of a circuit design, and legalizing the partitions using a processor according to a number of clocks in each partition and assignment of clock distribution tracks. Roots for implementing clock trees of the clocks are selected within the partitions.

20 Claims, 9 Drawing Sheets

| 100 | | | | |
|---|---|---|---|---|
| | 0 | 0 | 0 | 0 |
| | 0 | 0 | 0 | 0 |
| | 0 | 0 | 0 | 0 |
| | 0 | 0 | 0 | 1 |
| | 0 | 0 | 1 | 0 |

| 100 | | | | |
|---|---|---|---|---|
| | 0 | 0 | 0 | 0 |
| | 0 | 0 | 0 | 0 |
| | 0 | 0 | 0 | 0 |
| | 0 | 0 | 1 | 1 |
| | 0 | 0 | 1 | 1 |

| 100 | | | | |
|---|---|---|---|---|
| | 0 | 0 | 0 | 0 |
| | 0 | 0 | 0 | 0 |
| | 0 | 0 | 0 | 0 |
| | 0 | 0 | 1 | 1 |
| | 0 | 0 | 1 | 1 |

| 16 | 16 | 16 | 11 |
|----|----|----|----|
| 23 | 23 | 23 | 18 |
| 26 | 26 | 26 | 19 |
| 27 | 27 | 27 | 19 |
| 12 | 12 | 12 | 7 |

| 15 | 14 | 14 | 10 |
|----|----|----|----|
| 21 | 20 | 20 | 16 |
| 24 | 23 | 23 | 17 |
| 24 | 23 | 22 | 17 |
| 11 | 11 | 11 | 7 |

| 15 | 14 | 14 | 11 |
|----|----|----|----|
| 21 | 20 | 20 | 17 |
| 24 | 23 | 23 | 18 |
| 24 | 23 | 22 | 18 |
| 11 | 11 | 11 | 8 |

| 15 | 14 | 14 | 11 |
|----|----|----|----|
| 21 | 20 | 20 | 17 |
| 24 | 23 | 23 | 18 |
| 24 | 23 | 22 | 18 |
| 12 | 12 | 12 | 9 |

CLOCK REGION PARTITIONING AND CLOCK ROUTING

TECHNICAL FIELD

This disclosure relates to integrated circuits (ICs) and, more particularly, to clock region partitioning and clock routing circuit designs for implementation within an IC.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

Many ICs, including programmable ICs, utilize a predetermined and prefabricated clock architecture. Clock sources tend to be positioned in the middle portion of the IC. The clock sources are coupled to dedicated clock resources, e.g., wires. The clock resources extend out from the centrally positioned clock sources to couple to, and drive, clock loads throughout the IC. To a large extent, the path from a clock source to a clock load is predetermined.

SUMMARY

A method includes creating partitions for a plurality of clocks of a circuit design, legalizing the partitions using a processor according to a number of clocks in each partition and assignment of clock distribution tracks, and selecting roots for implementing clock trees of the clocks within the partitions.

A system includes a processor programmed to initiate executable operations. The executable operations include creating partitions for a plurality of clocks of a circuit design, legalizing the partitions according to a number of clocks in each partition and assignment of clock distribution tracks, and selecting roots for implementing clock trees of the clocks within the partitions.

A non-transitory computer-readable storage medium has instructions stored thereon which, when executed by a processor, perform a method. The method includes creating partitions for a plurality of clocks of a circuit design, legalizing the partitions using a processor according to a number of clocks in each partition and assignment of clock distribution tracks, and selecting roots for implementing clock trees of the clocks within the partitions.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 2 is a block diagram illustrating an exemplary data processing system.

FIGS. 5-1 through 5-4 are block diagrams illustrating partition creation.

FIG. 6 is a block diagram illustrating partition expansion.

FIGS. 7-1 and 7-2 are block diagrams illustrating the resolution of partition contention for locked clock sources.

FIGS. 8-1 through 8-3 are block diagrams illustrating a process of legalizing clock regions according to number of clocks.

FIGS. 10-1 and 10-2 are block diagrams illustrating the legalization of clock regions according to number of clocks.

FIGS. 11-1 through 11-2 are block diagrams illustrating a process of assigning clock distribution tracks and determining maximum size partitions for clocks.

FIGS. 13-1 through 13-2 are block diagrams illustrating a process of selecting roots for clocks and assigning clock routing and/or clock distribution tracks to clocks.

DETAILED DESCRIPTION OF THE DRAWINGS

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to clock region partitioning and clock routing a circuit design for implementation within an IC. In accordance with the inventive arrangements described herein, clock region partitioning and clock routing are performed for a circuit design. The IC in which the circuit design is implemented includes a mesh-like clock architecture formed of multiple layers. The multiple layers of the clock architecture allow improved implementation choices for clock region partitioning and clock routing where previously little or no choice was available.

The implementation techniques described within this disclosure facilitate improved quality of result (QOR) for clock region partitioning and clock routing. In one aspect, partitions for clocks of a circuit design are created. The partitions may be legalized. A clock root for the clocks may be selected within the partitions using the multiple layer clock architecture. Clock wiring resources, e.g., clock tracks, may also be assigned to the clocks within the partitions.

The inventive arrangements described herein may be implemented as a method or process performed by a data processing system. In another aspect, the inventive arrangements may be implemented as a data processing system having a processor. The processor, upon executing program code, performs the various operations described herein upon a circuit design. In still another aspect, the inventive arrangements may be implemented as a non-transitory computer-readable storage medium storing program code that, when executed, causes a processor and/or a system to perform and/or initiate a method or process.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
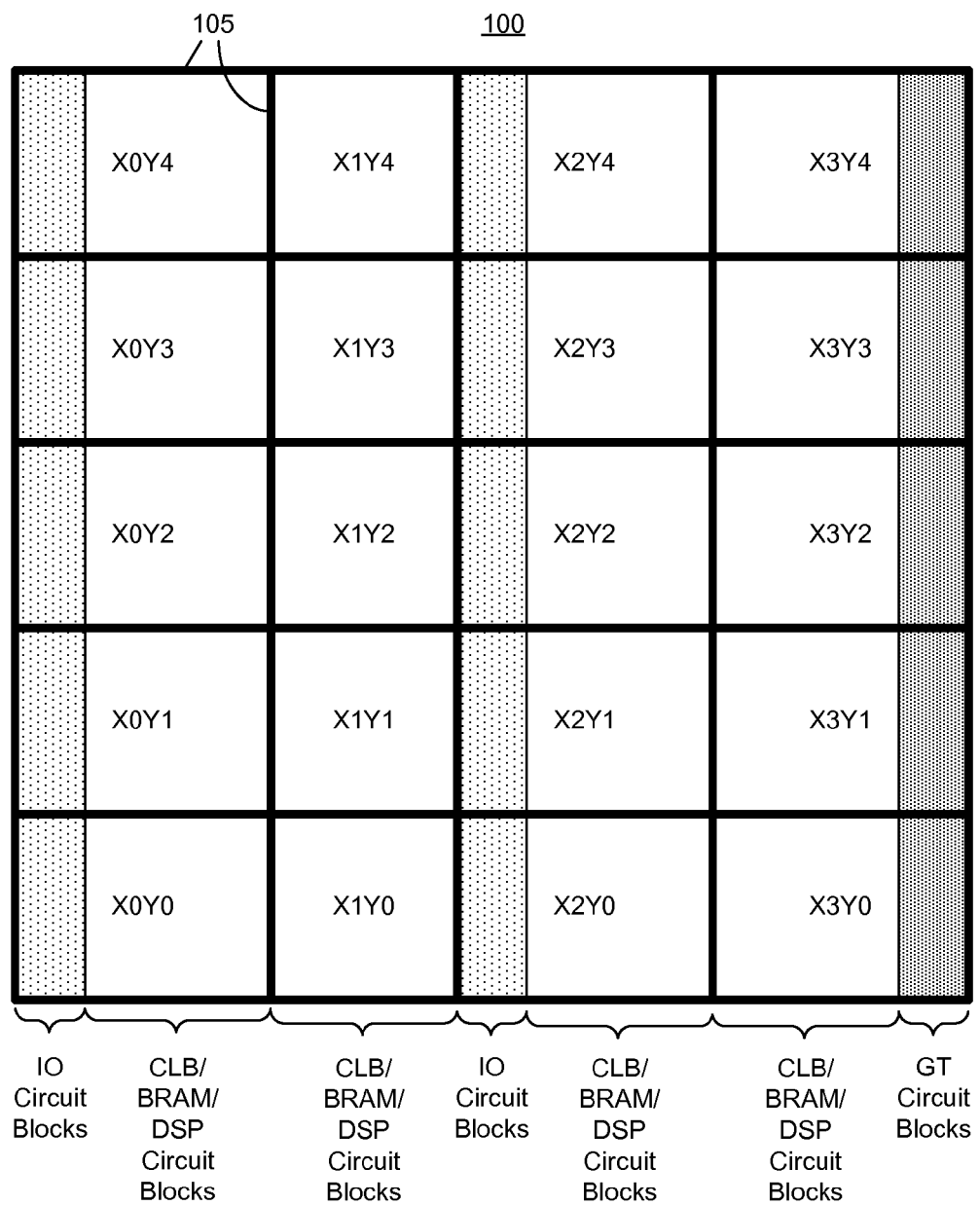
FIGS. 1-1 and 1-2 are block diagrams illustrating an exemplary clocking architecture for an integrated circuit.
Figure 1:
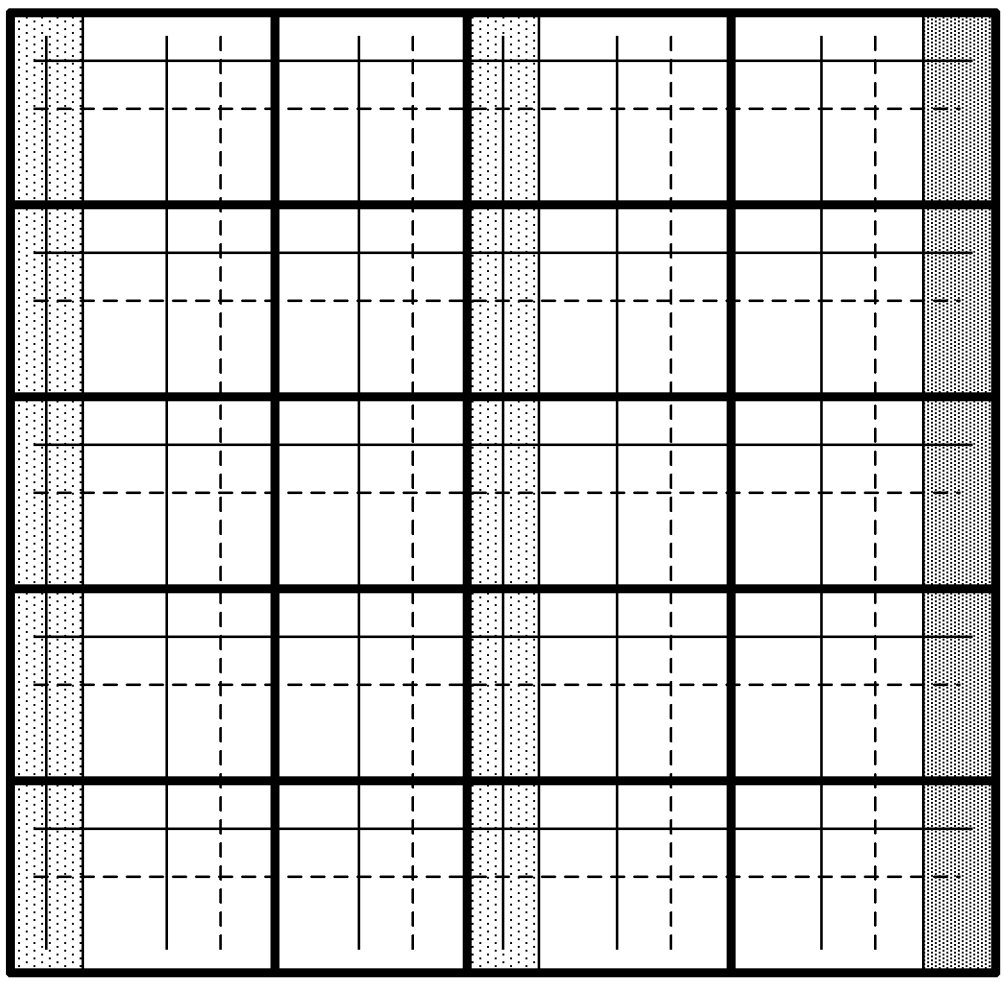
Figure 2:
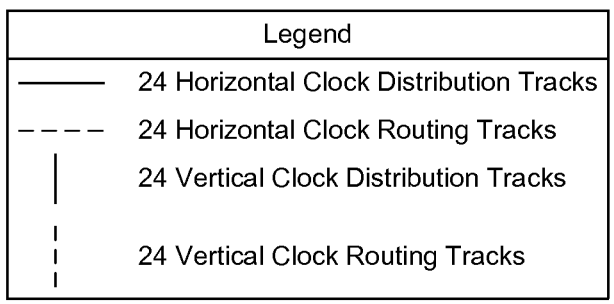
Figure 2:
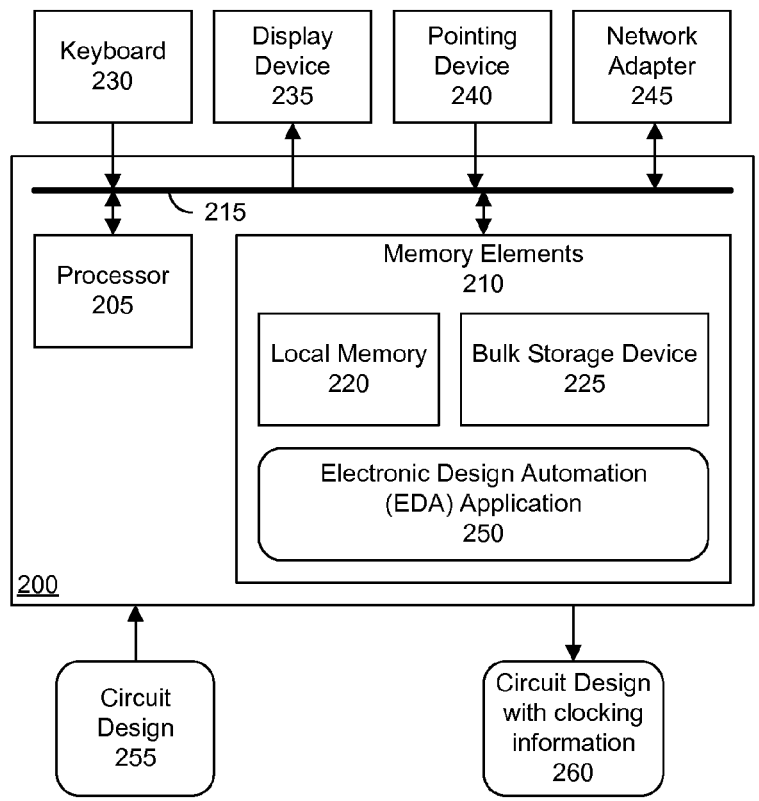

FIGS. 1-1 and 1-2 are block diagrams illustrating an exemplary clocking architecture 100 for an IC. In one aspect, clocking architecture 100 may be used for a programmable IC. For example, clocking architecture 100 may be used to implement an FPGA.

Referring to FIG. 1-1, clocking architecture 100 is divided into a grid including 5 rows and 4 columns. For purposes of illustration, columns are referred to using the x-coordinate of "X0," "X1," "X2," "X3," or "X4." Rows are referred to using the y-coordinate of "Y0," "Y1," "Y2," "Y3," or "Y4." The bold lines labeled 105 define, or outline, the boundaries of the clock regions. Thus, clocking architecture 100 includes 20 clock regions positioned in an x-y coordinate system with the aforementioned x and y coordinates.

Column X0 of clock regions, i.e., clock regions X0Y0, X0Y1, X0Y2, X0Y3, and X0Y4, include various types of circuit components. For example, each shaded portion of each clock region in column X0 includes an input/output bank (10) including a plurality of IO circuit blocks. The shaded portion of each clock region in column X0 may be referred to as the IO portion of the clock region. The non-shaded portion of each clock region in column X0 may include, but is not limited to, one or more configurable logic circuit blocks (CLBs), one or more block random access memories (BRAMs), and one or more digital signal processing circuit blocks (DSP). The non-shaded portion of each clock region in column X0 may be referred to as the CLB/BRAM/DSP portion.

Column X1 of clock regions, i.e., clock regions X1Y0, X1Y1, X1Y2, X1Y3, and X1Y4, include various types of circuit components. Each clock region in column X1 is entirely non-shaded and, for example, may include, but is not limited to, one or more CLBs, one or more BRAMs, and one or more DSPs.

Column X2 of clock regions, i.e., clock regions X2Y0, X2Y1, X2Y2, X2Y3, and X2Y4, include various types of circuit components. For example, each shaded portion of each clock region in column X2 includes one or more IOs. The non-shaded portion of each clock region in column X2 includes, but is not limited to, one or more CLBs, one or more BRAMs, and one or more DSPs. The shaded portion of each clock region in column X2 may be referred to as the IO portion of the clock region. The non-shaded portion of each clock region in column X2 may be referred to as the CLB/BRAM/DSP portion.

Column X3 of clock regions, i.e., clock regions X3Y0, X3Y1, X3Y2, X3Y3, and X3Y4, includes various types of circuit components. For example, each shaded portion of each clock region in column X3 includes one or more gigabit transceiver circuit blocks (GTs). The non-shaded portion of each clock region in column X3 includes one or more CLBs, one or more BRAMs, and one or more DSPs.

The IOs and GTs include clock source buffers. As such, clocks may be sourced from any clock region including a shaded portion. Thus, clock sources, or physical clock sites, may be located in shaded portions of column X0, X2, and X3. Clocks may not be sourced from any clock region in column X1.

Referring to FIG. 1-2, clocking architecture 100 is formed of a two-layer network of routing resources. The first layer is called the "clock routing network" and includes 24 horizontal clock routing tracks, i.e., wires, within each clock region and 24 vertical clock routing tracks in each clock region. The clock routing network is used to move the location of a clock source, e.g., a root of a clock tree, to a particular sub-region or location within a clock region without providing the clock signal to any clock loads. Once provided to the particular sub-region of the intended clock region, the clock signal may enter the second layer for distribution to clock loads. The clock routing network helps to reduce clock skew.

Within each clock region, a one-to-one bidirectional connection exists between any pair formed of a horizontal clock routing track and a vertical clock routing track. For example, consider the case where a clock uses horizontal clock routing track 0. The clock signal may be switched to vertical clock routing track 0 at the intersection of horizontal clock routing track 0 and vertical clock routing track 0. Within a different clock region, the clock signal may be switched from vertical clock routing track 0 back to horizontal clock routing track 0. Referring to FIG. 1-2, the IO and GT portions of clock regions do not include vertical clock routing tracks. It should be appreciated, however, that non-IO and non-GT portions of the aforementioned clock regions do include vertical clock routing tracks.

The second layer is called the "clock distribution network." The clock distribution network includes 24 horizontal clock distribution tracks in each clock region. Within each clock region within columns X0 and X2, 24 vertical clock distribution tracks are included in the IO portion of the clock region and another 24 vertical clock distribution tracks within the CLB/BRAM/DSP portion. The other columns, e.g., columns X1 and X3, include 24 vertical clock distribution tracks in each clock region.

The clock distribution network provides the clock signal to the clock loads. Within each clock region, a one-to-one unidirectional connection exists between any pair formed of a horizontal clock distribution track and a vertical clock distribution track. The unidirectional connection flows from vertical clock distribution track to horizontal clock distribution track. For example, a clock using vertical clock distribution track 0 may be switched to horizontal clock distribution track 0 at any possible intersection of horizontal clock distribution track 0 with vertical clock distribution track 0. There are no vertical distribution tracks within the GT portions of clock regions X3Y0, X3Y1, X3Y2, X3Y3, and X3Y4. It should be appreciated, however, that non-GT portions of the aforementioned clock regions do include vertical clock distribution tracks.

In general, clock signals flow from the clock routing network to the clock distribution network. It should be appreciated, however, that clock signals may flow directly to the clock distribution network without first traversing the clock routing network. Within clocking architecture 100, no path exists from a clock distribution track to a clock routing track. Once a clock signal enters the clock distribution network, the clock signal may only be provided to clock loads. Further, from either a horizontal or a vertical clock routing track, a clock signal must transition to the clock distribution network through a vertical clock distribution track prior to connecting to a horizontal clock distribution track. Thus, a one-to-one connection exists from every horizontal clock routing track and vertical clock routing track to a corresponding vertical clock distribution track.

As briefly discussed, a clock signal may be distributed from a clock source to a clock load in one of two different ways. The first way is to use clock routing tracks (e.g., the clock routing network) to move the clock signal to a particular sub-region of a clock region and then enter the clock distribution network to reach the clock loads. The second way is for the clock signal to bypass the clock routing network and directly enter the clock distribution network to reach the clock loads. The first way allows the clock source to be moved to a location that provides improved clock skew for the clock loads receiving the clock signal from the relocated clock source through the distribution network. The second way reduces the insertion delay that occurs when the clock routing network is used. In some cases, the clock source is already located at a location that is determined to be beneficial for reducing clock skew.

Clock skew is the difference in arrival time of a clock signal between the destination register and the source register. Ideally skew is minimized in a circuit design. Minimizing skew generally improves performance and scalability of a circuit design across process corners. Skew minimization, however, is not always achievable due to routing delay differences in the clock spine to the various registers. Positive clock skew is where the clock signal arrives later at the destination register than the source register for a data path. Negative clock skew is where the clock signal arrives earlier at the destination register than the source register of a data path.

Once a clock signal enters the clock distribution network, the clock signal travels a vertical clock distribution track and taps off at various horizontal clock distribution tracks. Before driving the horizontal clock distribution track, the clock signal passes through a programmable delay (not shown) and a clock enable circuit (not shown). From the horizontal clock distribution track, the clock signal may be provided to the clock loads. Each clock region can be driven at either end or by a driver within the segment. The drivers are tri-stable thereby allowing the clock distribution network to be segmented or isolated at each clock region boundary. By having the clock signal only use clock regions and portions of tracks within particular clock regions as needed, it allows the tracks to be reused in other clock regions.

Within clocking architecture 100, clock skew, and more particularly system hold issues, are addressed through the inclusion of programmable delays. Programmable delays may be included in each horizontal clock distribution track. The horizontal clock distribution tracks closer to the root of the clock tree are delayed to have a delay that is equivalent to the farthest horizontal clock distribution track. Otherwise, mismatch may occur due to the tracking of different buffer types across process, voltage, and temperature variation (PVT) and further due to on-chip variation (OCV).

FIG. 2 is a block diagram illustrating an exemplary data processing system (system) 200. System 200 includes at least one processor, e.g., a central processing unit (CPU), 205 coupled to memory elements 210 through a system bus 215 or other suitable circuitry. System 200 stores program code within memory elements 210. Processor 205 executes the program code accessed from memory elements 210 via system bus 215. In one aspect, system 200 is implemented as a computer or other data processing system that is suitable for storing and/or executing program code. It should be appreciated, however, that system 200 may be implemented in the form of any system including a processor and memory that is capable of performing the functions described within this disclosure.

Memory elements 210 include one or more physical memory devices such as, for example, a local memory 220 and one or more bulk storage devices 225. Local memory 220 refers to random access memory (RAM) or other non-persistent memory device(s) generally used during actual execution of the program code. Bulk storage device 225 may be implemented as a hard disk drive (HDD), solid state drive (SSD), or other persistent data storage device. System 200 may also include one or more cache memories (not shown) that provide temporary storage of at least some program code in order to reduce the number of times program code must be retrieved from bulk storage device 225 during execution.

Input/output (I/O) devices such as a keyboard 230, a display device 235, and a pointing device 240 may optionally be coupled to system 200. The I/O devices may be coupled to system 200 either directly or through intervening I/O controllers. A network adapter 245 may also be coupled to system 200 to enable system 200 to become coupled to other systems, computer systems, remote printers, and/or remote storage devices through intervening private or public networks. Modems, cable modems, Ethernet cards, and wireless transceivers are examples of different types of network adapter 245 that may be used with system 200.

As pictured in FIG. 2, memory elements 210 store an electronic design automation (EDA) application 250. EDA application 250, being implemented in the form of executable program code, is executed by system 200. As such, EDA application 250 is considered an integrated part of system 200. System 200, while executing EDA application 250, receives and operates upon a circuit design 255. Circuit design 255 is a programmatic description of circuitry to be implemented within an IC. For example, circuit design 255 may be specified using a hardware description language, as a netlist, as a configuration bitstream, a combination thereof, or the like.

Circuit design 255 is not yet routed with respect to clocks specified therein. As such, system 200 operates upon circuit design 255 to perform clock partitioning and/or clock routing. System 200, in executing EDA application 250, determines and/or defines the clock partitioning to be used and the clock routing, e.g., the wires of the clock routing network and/or the clock distribution network, wire connecting circuitry, and sequencing thereof to be used to implement clock domains of circuit design 255. System 200 outputs the resulting circuit design 260, which includes clock information specifying clock partitioning and/or clock routing for the circuitry specified therein.

Figure 3:
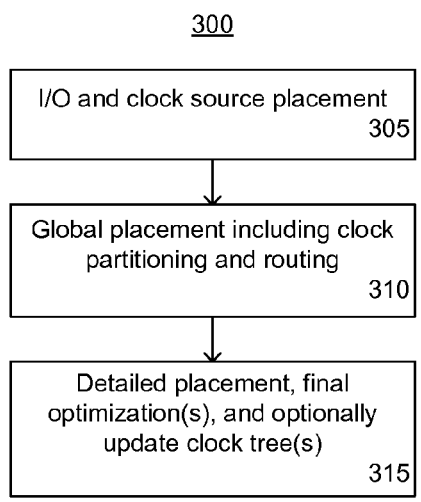
FIG. 3 is a flow chart illustrating an exemplary method of clock domain processing.

FIG. 3 is a flow chart illustrating an exemplary method 300 of clock domain processing. Method 300 may be implemented by system 200 of FIG. 2. Method 300 is a high level description. Further, method 300 illustrates how clock partitioning and clock routing may be performed during a placement flow for a circuit design such as circuit design 255.

In block 305, the system performs I/O and clock source placement. The system assigns I/Os and clock sources to particular locations on the IC. I/Os are assigned to physical I/O sites on the IC. Clock sources are assigned to physical clock sites on the IC. In block 310, the system performs global placement. During global placement, the system performs clock partitioning and clock routing as clock loads are assigned general locations on the IC using any of a variety of metrics including, but not limited to, minimization of total wire length, minimization of timing, reducing congestion, power minimization, and the like. As generally known, during global placement, the system assigns components of the circuit design to starting locations on the IC. The starting locations may only be coarsely specified, e.g., using a coarse grid system. The global placement that is determined need not be a legal placement in that more than one component may be assigned to a same or similar location on the IC.

In block 315, the system performs detailed placement. During detailed placement, the system moves or shifts the location of circuit components to achieve a legal placement of circuit components on the IC that does not violate any design rules and meets circuit design objectives. During detailed placement, only one circuit component, for example, may be assigned to a particular physical site of the IC. In accordance with the inventive arrangements described herein, the system may also perform final optimizations and optionally update clock trees in accordance with the results of the detailed placement as clock loads may be moved thereby requiring updating of the clock routing.

Within conventional circuit designs for ICs, and particularly for programmable ICs, the locations of clock sources and clock routes are largely fixed so that clock routing and/or updating of clock trees is not necessary. In accordance with the inventive arrangements described within this disclosure, clock trees may be implemented and moved nearly anywhere in the IC as described herein in further detail.

Figure 4:
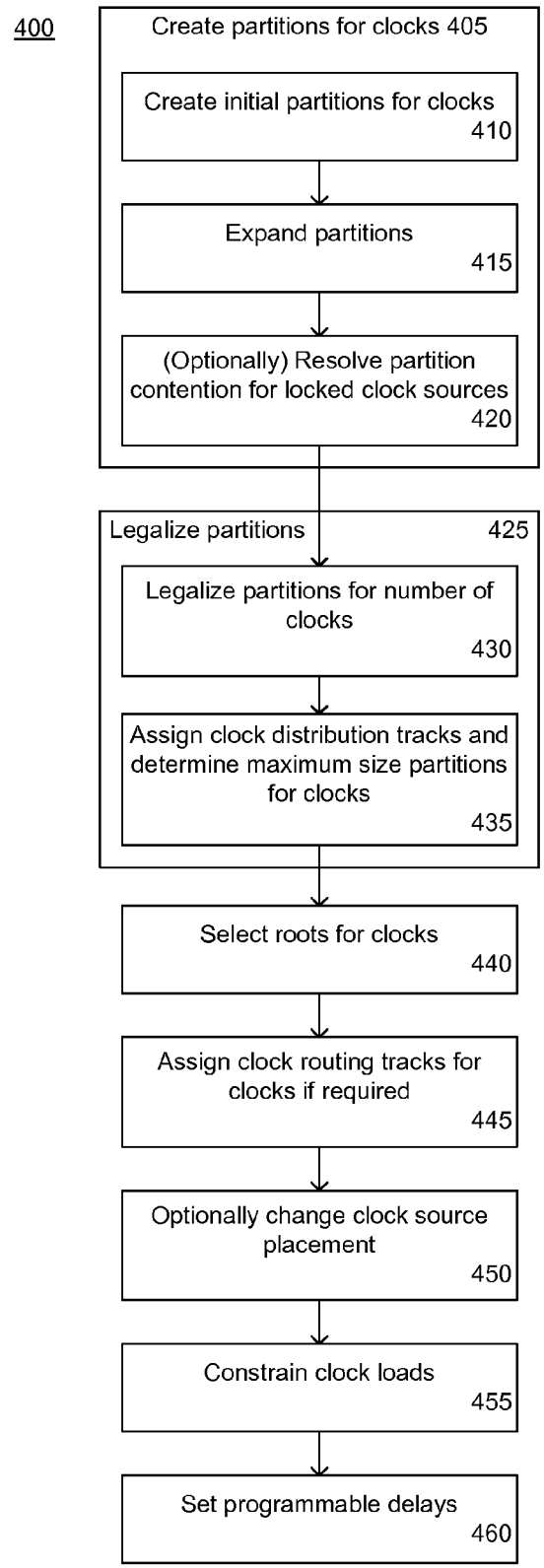
FIG. 4 is a flow chart illustrating another exemplary method of clock domain processing.

FIG. 4 is a flow chart illustrating another exemplary method 400 of clock domain processing. Method 400 illustrates a more detailed implementation of the clock domain processing briefly described with reference to FIG. 3. It should be appreciated, however, that the various blocks described with reference to FIG. 4 are described in further detail with reference to the remaining figures of this disclosure.

Method 400 may be performed by a system such as system 200 of FIG. 2 operating upon a circuit design to be implemented within an IC having a clocking architecture as described with reference to FIG. 1. Method 400 may begin in block 405, where the system creates partitions for the clocks of the circuit design. As part of block 405, in block 410, the system creates initial partitions for the clocks. In block 415, the system expands the partitions as needed. In block 420, the system optionally resolves partition contention for locked clock resources.

In block 425, the system begins a legalization process. In block 430, the system legalizes clock regions for the number of clocks included within the clock regions. In the example of FIG. 1, the number of clock routing tracks and clock distribution tracks in each clock region is 24. For purposes of illustration, each clock region therefore includes at most 24 clocks. It should be appreciated, however, that the number of clocks included in a given clock region is dependent upon the clocking architecture. As such, the inventive arrangements may be utilized in cases where the clocking architecture allows a maximum number of clocks that is fewer than 24 or more than 24. In block 435, the system assigns tracks and determines maximum size partitions for the clocks.

In block 440, the system selects roots for the clocks. In block 445, the system assigns clock routing tracks for the clocks. In block 450, the system optionally changes clock source placement. In block 455, the system constrains clock loads. In block 460, the system sets programmable delays as required. The various operations described with reference to FIG. 4 are described in greater detail below with reference to the remaining figures.

FIGS. 5-1 through 5-4 are block diagrams illustrating partition creation. FIG. 5, in reference to FIGS. 5-1 through 5-4 collectively, illustrates operations performed for block 410 of FIG. 4 in greater detail.

Referring to FIG. 5-1, the integer value placed in each clock region indicates the number of clocks that have been placed in that clock region. For purposes of illustration, only two clock regions include a clock. The clock regions are X2Y0 and X3Y1. When creating partitions, clock sources are placed first. The clock loads are initially placed following the clock sources using various metrics for placement such as wire length, timing, power consumption, and the like which ensure that loads are placed in and around, or near, the clock sources. In one aspect, clock loads may be placed in the same clock regions as the clock sources and/or in a clock region neighboring the clock region including the clock source. In this example, the clock sources and clock loads of the clock domain are all located within clock regions X2Y0 and X3Y1.

At this stage of clock partitioning, the placement that is achieved need not be a legal placement.

FIGS. 5-2 and 5-3 are block diagrams illustrating potential clock trees for the clock domain now located in clock regions X2Y0 and X3Y1. In order to construct a clock tree for a partition including the clock discussed in FIG. 5-1 that balances skew among the clock loads, a vertical distribution clock track is needed. The vertical distribution clock track may be implemented in column X2 or in column X3. In either case, a horizontal clock distribution track is needed in rows Y0 and Y1. FIG. 5-2 illustrates a clock tree with the vertical clock distribution track implemented in column X2. FIG. 5-3 illustrates a clock tree with the vertical clock distribution track implemented in column X3. FIGS. 5-2 and 5-3 illustrate that despite no clock loads being located in clock regions X2Y1 or X3Y0, clock resources, e.g., clock distribution tracks, will be required in those clock regions in order to implement the clock tree.

FIG. 5-4 illustrates an initial partition 505 for the clock. Initial partition 505 determined in block 410 includes clock regions X2Y0, X2Y1, X3Y0, and X3Y1. Initial partition 505 is rectangular in shape and reflects the reality that clocking resources of clock region X2Y1 and X3Y0 are required to implement the clock tree included therein.

FIG. 6 is a block diagram illustrating partition expansion. FIG. 6 illustrates operations performed for block 415 of FIG. 4 in greater detail. In general, a partition for a selected clock defines the area in which the same clocking resources (i.e., the same clock routing tracks and same clock distribution tracks) should be used for the selected clock. Further, the partition defines an area constraint dictating the area in which the clock loads of the selected clock may be moved during general placement.

In order to increase the likelihood of determining a feasible placement for the circuit design, the system attempts to find the largest partitions for the clocks. In the example of partition 505, the system performs an expansion of partition 505. In the simplified example of FIG. 5 using one clock, the system expands partition 505 to cover the entire IC as illustrated in FIG. 6 and referenced as partition 605, which is the expanded version of partition 505.

The system may expand a partition in each direction, i.e., up, down, left, and right. In one example, the system expands a partition until the partition has enough capacity for all loads. If a circuit design has 24 or fewer clocks, the partition for each clock may be expanded to cover the entire IC. In that case, no clock partitioning is required. Otherwise, the partition is expanded until the partition includes sufficient capacity for all loads.

For example, as the system expands a selected partition to include additional clock regions in a given direction, the number of hardware sites in the clock regions added to the selected partition are added to the capacity of the selected partition. The selected partition is expanded until the number of hardware sites in the selected partition is greater than or equal to the number of loads located in the clock regions belonging to the selected partition. The number of loads in the clock regions belonging to the selected partition includes all loads located within, not just assigned to, the selected partition. This includes any loads belonging to other partitions, but located in a clock region belonging to the other partition and the selected partition. In the case of a programmable IC, the programmable IC includes a finite number of available hardware sites to which components of a circuit design may be assigned during placement. Thus, hardware sites of clock regions added to a partition during expansion increase the capacity of the partition by the number of hardware sites added.

Figures 1, 7:
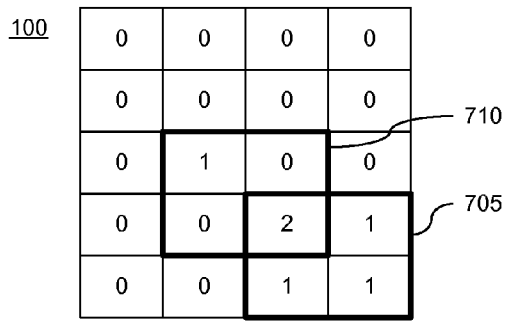
Figures 2, 7:
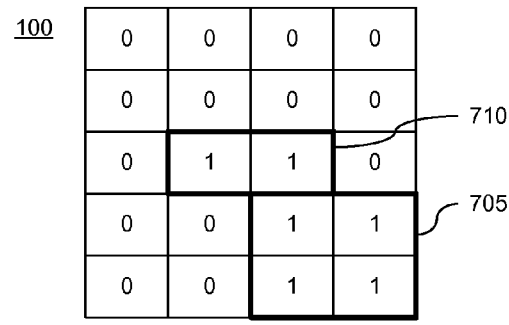

FIGS. 7-1 and 7-2 are block diagrams illustrating resolution of partition contention for locked clock sources. FIGS. 7-1 and 7-2, taken collectively, illustrate operations that may be performed in block 420 of FIG. 4. In some cases, users may place constraints on clock sources, or clock source buffers. Further, some clock source buffer locations are associated with particular restrictions due to the clocking architecture itself. For example, some clock source buffer locations may only utilize a particular, or unique, clock distribution track. In such cases, constraining a clock source buffer to a clock source buffer location, or physical clock site, with such a constraint dictates the particular clocking resources that must be used for that clock.

FIG. 7-1 illustrates a case where contention exists between partition 705 and partition 710 for clocking resources. In this example, the clock of partition 705 and the clock of partition 710 are constrained by the user to use a specific clock source buffer location. For purposes of illustration, the clocking resources for the two clock source buffer locations are the same, e.g., the two partitions are to use the same clock distribution track. Because the same clocking resources are shared between these two clocks, partition 705 and partition 710 may not overlap. FIG. 7-1 illustrates the overlap of partition 705 and partition 710. If partitions 705 and 710 are left overlapping and placement is continued, the resulting circuit may be un-routable.

FIG. 7-2 illustrates a resolution to the contention. The system modifies one of the initial partitions 705 or 710. In one aspect, the system moves the clock, including all clock loads of the clock, from the overlapping clock regions so that the resulting partitions do not overlap. In this example, the clock source(s) and clock loads of the clock of partition 710 located in clock region X2Y1 are moved or relocated to clock region X2Y2. FIG. 7-2 illustrates the resulting shape of partitions 705 and 710. As pictured, partitions 705 and 710 no longer overlap in any clock region. In another example, the clock source(s) and clock loads of clock of partition 710 located in clock region X2Y1 may be moved, or relocated to, clock region X1Y1.

In one aspect, the system selects the least critical clock net as the clock to be moved. As defined herein, the term "criticality," means timing criticality and is determined according to the timing requirements of the clock loads of the clock source. The clock loads are moved to one or more neighboring clock regions. Thus, referring to the example of FIG. 7-2, the clock within partition 710 is determined to be less critical than the clock of partition 705 and is therefore moved to resolve the contention.

Figures 1, 8:
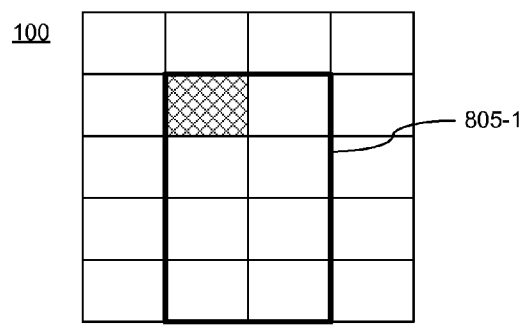
Figures 2, 8:
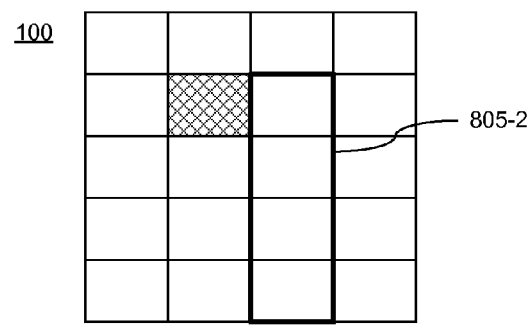
Figures 3, 8:
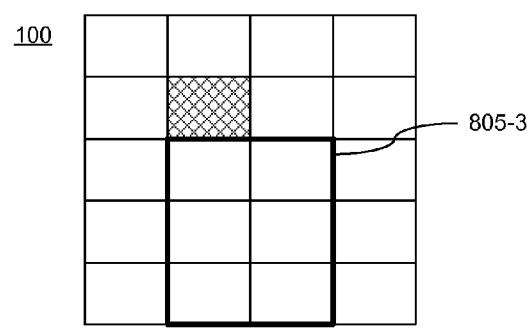

FIGS. 8-1 through 8-3 are block diagrams illustrating a process of legalizing clock regions according to number of clocks. More particularly, FIGS. 8-1 through 8-3, taken collectively and referred to collectively as FIG. 8, illustrate a process of legalizing partitions according to the number of clocks included therein. FIG. 8 illustrates the operations performed in block 430 of FIG. 4 in greater detail.

As briefly discussed, clock sources are forced to be located within the same partition as the clock loads of the clock. This requirement simplifies the clock partitioning problem in that the system need only legalize clock regions and ensure that no contention exists on the clock distribution network. Accordingly, there is no need to perform legalization for the clock routing network since each clock source is already inside the same clock partition as the clock loads of the clock. By guaranteeing that clocking resources are available in the partitions, the clock routing track for a specific clock distribution track assigned to a given clock will be available.

FIG. 8-1 illustrates a partition 805-1. Within partition 805-1, clock region X1Y3 is congested. As defined within this disclosure, the term "congested" means that a clock region includes more clocks than permitted. Using the exemplary clocking architecture 100, the maximum number of clocks that may be assigned to a clock region is 24. Thus, clock region X1Y3 includes more than 24 clocks and legalization, at least in terms of number of clocks, requires that the total number of clocks in any clock region of a partition not exceed 24.

In one aspect, congestion in clock region X1Y3 is removed by cutting partition 805-1 to exclude clock region X1Y3. In cutting, or resizing, partition 805-1, the system either cuts a column or a row from partition 805-1. FIG. 8-2 illustrates an example in which the system cuts a column from partition 805-1. In the example of FIG. 8-2, the resized version of partition 805-1, referred to as partition 805-2, is cut to include only clock regions X2Y0, X2Y1, X2Y3, and X2Y4. Clock regions X1Y0, X1Y1, X1Y3, and X1Y4 are removed.

In cutting, or resizing, partition 805-1, a clock from clock region X1Y3 is moved out of clock region X1Y3 and into the resized partition 805-2. In the example of FIG. 8-2, all clock loads of the clock that is moved from region X1Y3 are moved from each other clock region in the same column, i.e., moved from clock regions X1Y0, X1Y1, X1Y3, and X1Y3, into the partition 805-2. The result is that the number of clocks assigned to region X1Y3 is reduced.

FIG. 8-3 illustrates an example in which the system cuts a row from partition 805-1. In the example of FIG. 8-3, the resized version of partition 805-1, now referred to as partition 805-3, is cut to include only clock regions X1Y0, X1Y1, X1Y2, X2Y0, X2Y1, and X2Y3. Clock regions X2Y3 and X1Y3 are removed. In cutting, or resizing, partition 805-1, a clock from clock region X1Y3 is moved out of clock region X1Y3 and into the resized partition 805-3. In the example of FIG. 8-3, all clock loads of the clock that is moved from region X1Y3 are moved from each other clock region in the same row, i.e., moved from clock regions X1Y3 and X2Y3, into the partition 805-3. The result is that the number of clocks assigned to region X1Y3 is reduced.

In one aspect, the system, while legalizing the number of clocks within the clock regions of the partitions, selects the resulting partition that is the largest in area. Thus, referring to FIGS. 8-2 and 8-3, the system cuts a row from partition 805-1 to generate resulting partition 805-3.

Figure 9:
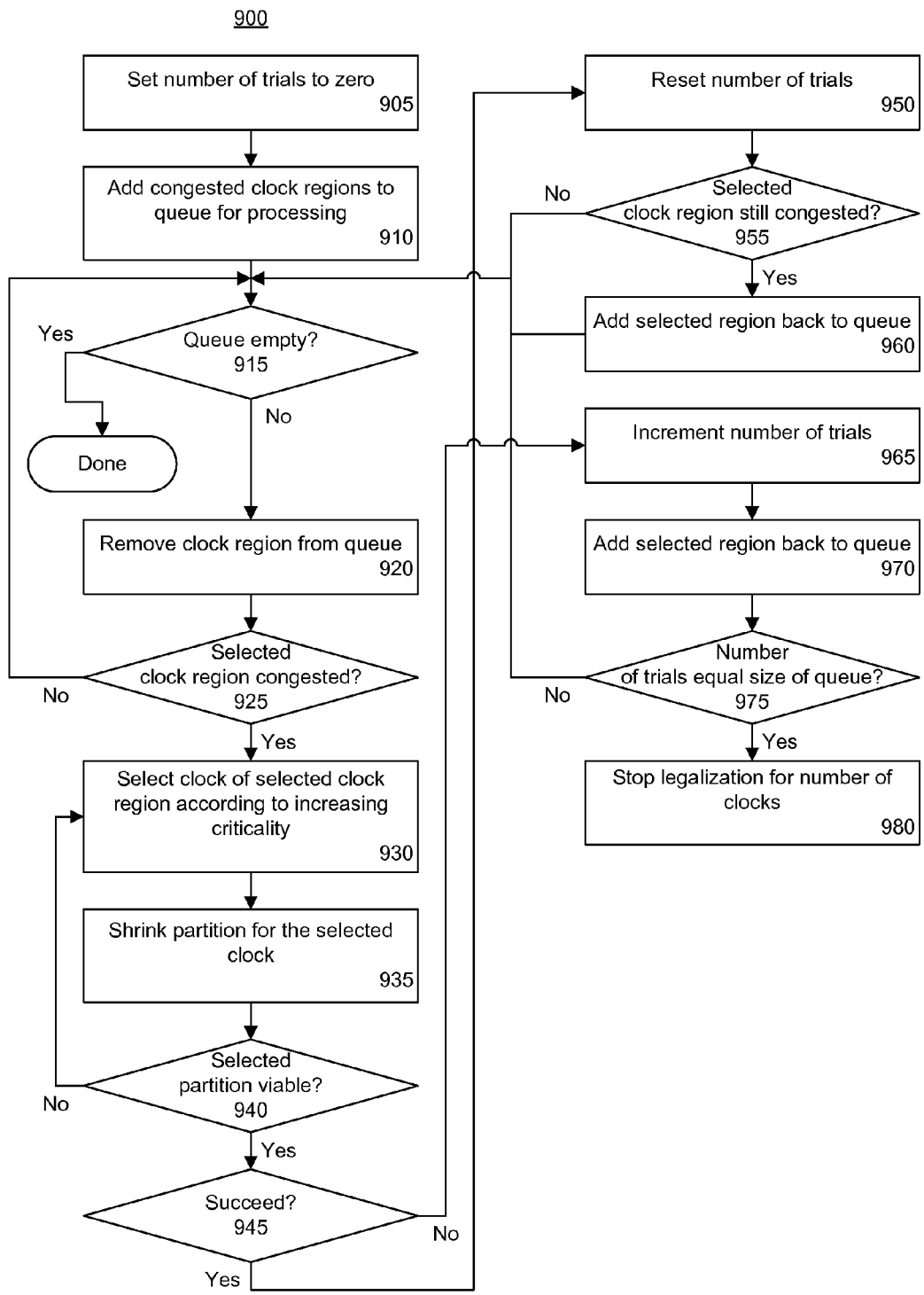
FIG. 9 is a flow chart illustrating an exemplary method of legalizing clock regions according to number of clocks.

FIG. 9 is a flow chart illustrating an exemplary method 900 of legalizing clock regions according to number of clocks. Method 900 illustrates a more detailed example of the procedure generally described in block 430 of FIG. 4 and in FIGS. 8-1 through 8-3.

In block 905, the system sets a number of trials to zero. The number of trials is a value used to determine when to terminate processing. In block 910, the system adds the congested clock regions, i.e., those clock regions with more clocks assigned than the maximum number of clocks permitted, to a queue for processing. In block 915, the system determines whether the queue is empty. If so, method 900 ends. If not, method 900 continues to block 920.

In block 920, the system removes a clock region from the queue. In block 925, the system determines whether the selected clock region is congested. Block 925 is performed as a threshold operation upon selecting a clock region from the queue since prior processing of another clock region may have affected the selected clock region. More particularly, in relocating loads of a clock region processed in a prior iteration, the selected clock region may have been affected in that the number of clocks assigned thereto may be reduced thereby rendering the selected clock region "not congested."

If the selected clock region is not congested, e.g., is no longer congested, method 900 may loop back to block 915 to continue processing and select another clock region in the event the queue is not empty. If the selected clock region is congested, method 900 continues to block 930.

In block 930, the system selects a clock within the selected clock region. The clock is selected according to increasing criticality. More particularly, the system selects the clock that is least critical of the clocks occupying, or located within, the selected clock region.

In block 935, the system shrinks the partition that includes the selected clock from block 930. The system shrinks the partition in accordance with the general technique illustrated with reference to FIGS. 8-1 through 8-3. As discussed, the system, when presented with multiple candidate options, e.g., shapes, for shrinking the partition, selects the candidate partition shape having the largest area.

An exception to selecting the partition with the largest area is the case where the partition with the largest area violates a user imposed or IC architecture imposed constraint. In that case, the second largest partition is selected.

In block 940, the system determines whether the selected partition is viable. The determination of whether a partition is viable is one where the system evaluates one or more different metrics. If the partition meets the metric, or metrics, that are evaluated, the partition is considered viable. A partition may be viable and still be considered congested. Similarly, a partition may be viable and also uncongested.

In one aspect, a viable partition is one that includes sufficient capacity to accommodate the loads of clocks assigned thereto. In the case of a programmable IC, for example, the partition includes sufficient hardware resources, or sites, to which clock loads of the partition may be assigned. In another aspect, a partition that is viable is one that meets any established constraints, whether user imposed or imposed due to the clock region architecture itself.

If the partition is viable, method 900 breaks the loop formed of blocks 930, 935, and 940, and continues to block 945. If the partition is not viable, method 900 loops back to block 930 to select another clock of the selected clock region. As noted, the clocks are selected in order of increasing criticality. As such, the next clock selected is determined to be more critical than the prior clock selected from the same clock region.

In block 945, the system determines whether processing in block 935 succeeded. More particularly, the system determines whether congestion for at least one clock region is reduced, which is considered a success. If the system determines that congestion reduction is a success, method 900 continues to block 950. If not, method 900 proceeds to block 965.

Continuing with block 950, the system resets the number of trials. In block 955, the system determines whether the selected clock region is still congested. If so, method 900 continues to block 960, where the selected clock region is added back to the queue. The selected clock region may be added to the end of the queue. If the selected region is no longer congested, method 900 loops back to block 915 to continue processing. After block 960, method 900 also loops back to block 915 to continue processing.

Proceeding with block 965, the system increments the number of trials. In block 970, the system adds the selected clock region back to the queue. The selected clock region may be added to the end of the queue.

In block 975, the system determines whether the number of trials is equal to the size of the queue. The size of the queue is measured in terms of the number of clock regions contained therein. Thus, when the number of trials is equal to the number of clock regions in the queue, method 900 may proceed to block 980, where legalization for number of clocks in the clock regions terminates. If the number of trials is not equal to, e.g., is less than, the size of the queue, method 900 may loop back to block 915 to continue processing.

FIGS. 10-1 and 10-2 are block diagrams illustrating the legalization of clock regions according to number of clocks. FIG. 10-1 illustrates the clock regions of an IC using clocking architecture 100 prior to implementation of method 900. As pictured, clock regions X0Y1, X0Y2, X1Y1, X1Y2, X2Y1, and X2Y2 are congested as each of the aforementioned clock regions is assigned more than 24 clocks.

FIG. 10-2 illustrates the state of the circuit design as applied to the IC after implementation of method 900. As pictured, the clock regions are no longer congested as each clock region includes fewer than 24 clocks. As previously noted, since partitions for clocks may include both congested clock regions and other non-congested clock regions, the updating of a partition when moving a clock out of a congested clock region will affect other clock regions.

FIGS. 11-1 through 11-2 are block diagrams illustrating a process of assigning clock distribution tracks and determining maximum size partitions for clocks. More particularly, FIGS. 11-1 through 11-2, taken collectively and referred to as FIG. 11, illustrate an exemplary process of implementing block 435 of FIG. 4.

In general, clocks are assigned clock distribution tracks in decreasing order of criticality starting with the most critical continuing to the least critical. Clocks that are processed earlier have an increased likelihood of having a larger partition, which is beneficial for placing more critical clock nets. Each clock is processed using a variety of attributes. The attributes include, but are not limited to, clock source type, whether the clock already has some established or set routing, and whether the user has placed constraints on the clock. Based upon the attributes, a specific ordering of clock track numbers is used to assign tracks to the clock.

For example, each clock source type has different and particular connectivity to the clocking network. In illustration, BUFGCE clock sources have a dedicated clock track. For clocks implemented using the BUFGCE clock sources, the system attempts to utilize the dedicated clock distribution track for the relevant clock source type. If during the clock distribution track assignment process the system determines that a different clock distribution track will result in a larger partition for the clock, the system moves the clock source to a physical clock site having the different clock distribution track as the dedicated clock distribution track. The clock distribution track ordering for any clock will be handled in a manner that results in minimal disruption to the current clock source placement.

For any given track, the system determines the maximum rectangle containing the minimal partition of the clock source. As used herein, a "minimal partition" means one or more clock regions where a clock net is locked, i.e., the clock net has loads constrained to the one or more clock regions. In this regard, a minimal partition for a clock represents the clock regions from which the clock net cannot be moved. If a clock does not have a minimal partition, the system looks for the largest partition that contains the clock source.

Referring to FIG. 11-1, a most critical clock is selected. Partition 1105 is the partition for the selected, most critical clock and is shown in bold outline. Partition 1105 extends from clock region X0Y0 to clock region X2Y4. The dashed lines represent an expansion of clock region 1105 as the system determines the maximum rectangle for the partition. FIG. 11-1 continues from FIG. 10-2. As illustrated, as partition 1105 is enlarged, the number of clocks indicated in each clock region of column X3 is increased by one.

A next most critical clock may be selected for processing. If the next clock has a partition that already covers the entire IC, then no expansion of that clock region is required.

FIG. 11-2 illustrates the processing of a next, or third, most critical clock. The third most critical clock has a partition 1110 and extends from clock region X0Y1 to X3Y4. As illustrated, partition 1110 is expanded downward to include clock regions in row Y0. Comparing the values indicated in the clock regions of row Y0 reveals that the value in each clock region is increased by one in FIG. 11-2 compared to FIG. 11-1 as partition 1110 is enlarged.

Figure 12:
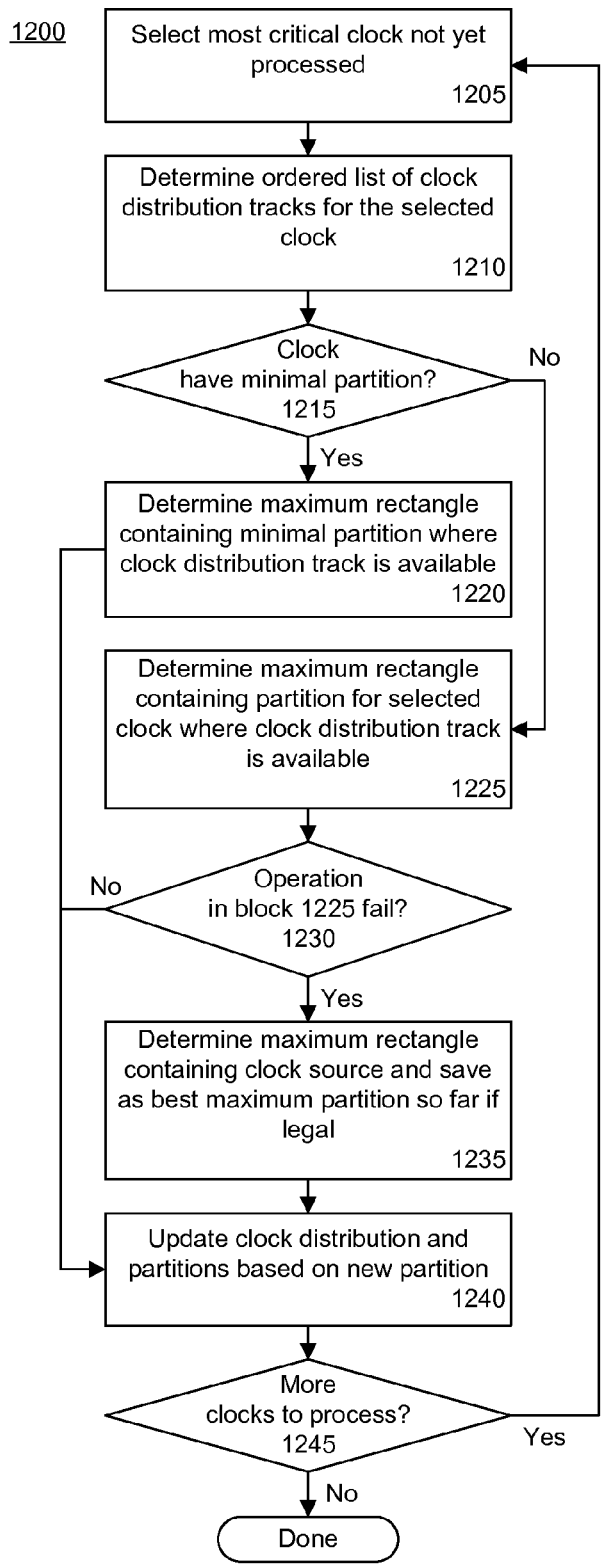
FIG. 12 is a flow chart illustrating an exemplary method of assigning clock distribution tracks and determining maximum size partitions for clocks.

FIG. 12 is a flow chart illustrating an exemplary method 1200 of assigning clock distribution tracks and determining maximum size partitions for clocks. Method 1200 illustrates a more detailed example of the procedure generally described in block 435 of FIG. 4 and in FIGS. 11-1 through 11-2. In block 1205, the system selects the most critical clock that is not yet processed.

In block 1210, the system determines an ordered set of clock distribution tracks for the selected clock. The ordering of tracks in the list is based on a heuristic to maximize track usage and reduce the need for re-placing clock sources. In general, the ordering of clock distribution tracks for the clocks is dependent upon the clocking architecture of the IC. There are several different types of clock sites and each type has distinct characteristics in terms of connectivity and limitations relating to connecting to clock distribution tracks.

For example, each clock region that contains an IO bank includes 24 BUFGCE clock sites, 8 BUFGCTRL clock sites, and 4 BUFGCE_DIV clock sites. Clock regions that contain GT resources have 24 BUFG_GT clock sites. Further, different clock source sites access different sets of clock distribution tracks. A clock source placed at a BUFGCE clock site or a BUFG_GT clock site has access to only one clock distribution track corresponding to the clock site at which the clock source is placed. By comparison, clock sources placed at BUFGCTRL clock sites or BUGCE_DIV clock sites have access to all 24 clock distribution tracks.

Another architectural constraint is that any BUFGCTRL clock site shares inputs with two distinct BUFGCE clock sites. In consequence, placement of a clock source at a BUFGCTRL clock site may block the two corresponding BUFGCE clock sites. Similarly, any clock source placed at a BUFGCE_DIV clock site shares inputs with a distinct BUFGCE clock site. Accordingly, placement of a clock source at a BUFGCE_DIV clock site may block the BUFGCE clock site.

The system determines a list of "preferred tracks" for each clock source based on the placement location of the clock source. For BUFGCE clock sites and BUFG_GT clock sites, for example, there is only one preferred clock distribution track which is the clock distribution track corresponding to the particular site where the clock source is currently placed. For a clock source placed at a BUFGCE_DIV clock site, there is one preferred clock distribution track which is the clock distribution track corresponding to the BUFGCE clock site that shares input with the BUFGCE_DIV clock site. For a clock source placed at a BUFGCTRL clock site, there are two preferred clock distribution tracks corresponding to the two BUFGCE clock sites that share input with the BUFGCTRL clock site.

With the above clocking architecture features in mind, the system determines the preferred, or ordered, set of clock distribution tracks for each clock using the following set of rules.

> If a clock is already assigned a clock distribution track, i.e., in the case of BUFGCE clock sites and BUFG_GT clock sites, use only that clock distribution track and return.
>
> For any clock source type, first add the preferred clock distribution track numbers as described above.
>
> For clock sources at BUFGCE clock sites, add clock distribution tracks corresponding to other BUFGCE clock sites that have no sharing with any other BUFGCTRL clock site or BUFGCE_DIV clock site. Next add clock distribution tracks corresponding to BUFGCTRL clock sites. Next add clock distribution tracks corresponding to BUFGCE_DIV clock sites. For BUFGCTRL and BUFGCE_DIV clock sites, consider the current number of BUFGCTRL and BUFGCE_DIV clock sources in the given region and exclude some clock distribution tracks based on this required number to use only a sufficient number of clock distribution tracks and leaving unused clock distribution tracks.
>
> For clock sources placed at BUFGCTRL clock sites, add preferred clock distribution tracks for all BUFGCTRL clock sites. Next add preferred clock distribution tracks for all BUFGCE_DIV clock sites. Next add preferred clock distribution tracks for all BUFGCE clock sites.
>
> For clock sources placed at BUFGCE_DIV clock sites, add preferred clock distribution tracks for all BUFGCE_DIV clock sites. Next add preferred clock distribution tracks for all BUFGCTRL clock sites. Next add preferred clock distribution tracks for all BUFGCE sites.
>
> For clock sources placed at BUFG_GT clock sites, add all clock distribution tracks.

The rules described herein are correlated with the clocking architecture described. It should be appreciated, however, that other techniques and/or rules for ordering clock distribution tracks may be used that vary from those described and that depend upon the particular clocking architecture of the IC being used. Such techniques may be used and implemented for block 1210 in place of those described above. As such, the inventive arrangements are not intended to be limited to one manner or technique for ordering clock distribution tracks for use by clocks. Any appropriate ordering and/or sequencing technique that accounts for clocking architecture characteristics and constraints may be used.

In block 1215, the system determines whether the clock has a minimal partition. If so, method 1200 continues to block 1220. If not, method 1200 proceeds to block 1225.

In block 1220, the system determines a maximum rectangle that contains the minimal partition where a highest ranked clock distribution track from the ordered list of clock distribution tracks is available. For example, if a maximum rectangle cannot be determined that includes the first clock distribution track from the ordered list of clock distribution tracks, the system attempts to determine a rectangle that includes the second clock distribution track, etc., until a rectangle is determined that includes a clock distribution track from the list of clock distribution tracks. After block 1220, method 1220 continues to block 1240.

In block 1225, the system determines a maximum rectangle containing a partition for the selected clock where the clock distribution track is available. In block 1230, the system determines whether the operation performed in block 1225 failed. If so, method 1200 continues to block 1235. If not, method 1200 proceeds to block 1240.

In block 1235, the system determines the maximum rectangle containing a clock source and saves the rectangle as the best maximum partition so far. The system saves the rectangle as the best maximum partition so far if it is viable as previously described within this disclosure.

In block 1240, the system updates the clock distribution tracks and partitions based on new partitions, e.g., the expended or enlarged partitions. In block 1245, the system determines whether any further clocks remain to be processed. If so, method 1200 loops back to block 1205. If not, method 1200 ends.

FIGS. 13-1 through 13-2 are block diagrams illustrating a process of selecting roots for clocks and assigning clock routing tracks to the clocks. More particularly, FIGS. 13-1 through 13-2, taken collectively and referred to as FIG. 13, illustrate an exemplary process of implementing blocks 440 and 445 of FIG. 4.

In general, once clocks have been partitioned, legalized, and clock distribution tracks have been assigned, clock trees may be created for each clock in the circuit design. The system may build clock trees in one of three different configurations.

In the first configuration, the clock source is used, or selected, as the root of the clock tree. The clock signal is routed directly from the clock source onto the distribution network of the partition for the clock to the clock loads.

In the second configuration, a node is selected that is different from the clock source. The selected node is used as the root of the clock tree. The system first uses clock routing tracks to connect the clock source to the root that provides improved clock skew for the partition. From the root, the system uses the distribution network to drive the clock loads of the partition.

The third configuration is where the system uses multiple nodes as roots. When using multiple nodes, the system may connect clock loads to the clock source directly using the distribution network. The clock source also may be connected to one or more other nodes selected as roots through the clock routing network. The one or more roots are then connected to other clock loads using the clock distribution network.

Referring to FIG. 13-1, a partition 1305 is illustrated having a clock source 1310 located within clock region X0Y2. Loads of clock source 1310 are located throughout clock regions X0Y1, X0Y2, and X0Y3, i.e., throughout partition 1305. To achieve minimum clock skew among the clock loads, the system selects the root of the clock tree to be located at the center of partition 1305. Because clock source 1310 is already located at the center of partition 1305, clock source 1310 need not be moved or relocated using the clock routing network. In this example, the clock source is therefore selected as the root of the clock tree. The clock tree is built completely using the clock distribution network (shown with solid lines).

FIG. 13-2 illustrates a partition 1320 where, during placement, the clock loads of clock source 1315 moved away. The center of partition 1320 is no longer close to clock source 1315. In this example, the system selects node 1325 as the root of the clock tree, which is located at the center of partition 1320. Clock source 1315 is routed to node 1325 using the clock routing network (shown with dashed lines). From root node 1325, the clock signal may be provided to the clock loads using the clock distribution network.

In one aspect, the routing of a clock source to a root node may take any possible path over the clock routing network. For example, the path may be a staircase pattern, one that goes entirely vertical and then entirely horizontal. In another example, the path may be a Manhattan pattern that traverses horizontally first, then vertically. The clock trees may be built one or more times during placement and may be used during timing analysis to provide up-to-date estimates for clock delay information.

With clock networks partitioned and routed, the system creates an area constraint for each the clock loads of each clock that corresponds to the final partitions as noted in block 455 of FIG. 4. The area constraints ensure that clock loads will not move to clock regions that may cause congestion.

Using the clock routing network to move the clock source is beneficial for skew. The clock routing network does not alleviate hold issues that may exist. Block 460 of FIG. 4 is directed to addressing hold issues by setting programmable delays located on the horizontal clock distribution tracks. More particularly, the horizontal clock distribution tracks that are closest to the root of the clock tree are delayed to have equal delay as the horizontal clock distribution tracks that are farther from the root node.

The system further may store any routing data determined for the clock trees within a routing database for subsequent use in routing the circuit design. The routing information determined for the clocks, for example, may include a routing from clock source to a root of a clock tree and a routing from the root of the clock tree to each horizontal clock distribution track, including programmable delay settings, if any.

In one aspect, the routing information may not include specific detail of the path between the clock sources and the clock loads. For example, the path between clock source and root may be represented as clock source→gap nodes→root node. Similarly, the path from the root to the clock loads may be specified as root node→gap→each horizontal clock distribution track→gap→clock loads on that horizontal clock distribution track. By broadly specifying paths in terms of nodes, as opposed to specific wiring resources, the routing process is provided with increased flexibility as to how best to route the circuit design.

In accordance with the inventive arrangements described within this disclosure, clock domain processing techniques are provided that allow clock trees to be located throughout a given IC. Locating clock trees throughout the IC provides flexibility in design not previously achieved with more static and centrally located clocking architectures. Further, the roots of the clock trees may be relocated to desirable locations for clock skew using a first clocking network. Distribution of the clock signal to the clock loads, whether directly from a clock source or from a relocated root of the clock tree may be performed using a second and different clocking network.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

As defined herein, the term "automatically" means without user intervention. As defined herein, the term "user" means a human being. The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when," "upon," "in response to determining," "in response to detecting," "responsive to determining," or "responsive to detecting," depending on the context. Similarly, the phrase "if it is determined" or the phrase "if [a stated condition or event] is detected" may be construed to mean "upon determining," "in response to determining," "responsive to determining," "upon detecting [the stated condition or event]," "in response to detecting [the stated condition or event]," or "responsive to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a computer program product, which includes all the features enabling the implementation of the methods described herein. The computer program product includes a computer-readable data storage medium. As defined herein, the term "computer-readable storage medium" means a storage medium that contains or stores program code for use by or in connection with an instruction execution system, apparatus, or device. As defined herein, a "computer-readable storage medium" is non-transitory and, as such, is not a transitory propagating signal per se. Examples of a computer-readable storage medium may include, but are not limited to, optical media, magnetic media, magneto-optical media, computer memory such as random access memory, a bulk storage device, e.g., hard disk, or the like.

The flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified logical function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect, the blocks in the flow chart illustration may be performed in increasing numeric order corresponding to the numerals in the various blocks. In other aspects, the blocks may be performed in an order that is different, or that varies, from the numerals in the blocks. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The corresponding structures, materials, acts, and equivalents of all means or step plus function elements in the claims below are intended to include any structure, material, or act for performing the function in combination with other claimed elements as specifically claimed.

A method includes creating partitions for a plurality of clocks of a circuit design, legalizing the partitions using a processor according to a number of clocks in each partition and assignment of clock distribution tracks, and selecting roots for implementing clock trees of the clocks within the partitions.

In one aspect, creating the partitions may include expanding the partitions to a rectangular shape including a source of the clock. In another aspect, creating the partitions may include resolving partition contention for a locked clock source by reducing a size of a first partition overlapping a selected clock region of a second partition to exclude the selected clock region and relocating clock loads of the first partition within the first partition of reduced size.

Legalizing the partitions may include legalizing the partitions according to number of clocks by reducing a size of a selected partition covering a selected clock region comprising a number of clocks exceeding a capacity of the selected clock region to exclude the selected clock region and relocating clock loads of the selected partition out of the selected clock region and into the selected partition of reduced size.

Reducing the size of the selected partition may include selecting a largest shape from a plurality of candidate shapes for the selected partition that has reduced size and that excludes the selected clock region.

In one aspect, legalizing the partitions may include assigning clock distribution tracks to the partitions and determining a maximum size for the partitions. In another aspect, legalizing the partitions may include assigning clock distribution tracks to the plurality of clocks.

In some cases, the selected root is a different node of an IC from a clock source for a clock. In that case, the method may include assigning a clock routing track to the clock.

A system includes a processor programmed to initiate executable operations. The executable operations include creating partitions for a plurality of clocks of a circuit design, legalizing the partitions according to a number of clocks in each partition and assignment of clock distribution tracks, and selecting roots for implementing clock trees of the clocks within the partitions.

In one aspect, creating the partitions may include expanding the partitions to a rectangular shape including a source of the clock. In another aspect, creating the partitions may include resolving partition contention for a locked clock source by reducing a size of a first partition overlapping a selected clock region of a second partition to exclude the selected clock region and relocating clock loads of the first partition within the first partition of reduced size.

Legalizing the partitions may include legalizing the partitions according to number of clocks by reducing a size of a selected partition covering a selected clock region having a number of clocks exceeding a capacity of the selected clock region to exclude the selected clock region and relocating clock loads of the selected partition out of the selected clock region and into the selected partition of reduced size.

Reducing the size of the selected partition may include selecting a largest shape from a plurality of candidate shapes for the selected partition that has reduced size and that excludes the selected clock region.

In one aspect, legalizing the partitions may include assigning clock distribution tracks to the partitions and determining a maximum size for the partitions. In another aspect, legalizing the partitions may include assigning clock distribution tracks to the plurality of clocks.

The selected root may be a different node of an IC from a clock source for a clock. In that case, the processor may be further programmed to initiate executable operations including assigning a clock routing track to the clock.

A non-transitory computer-readable storage medium has instructions stored thereon which, when executed by a processor, perform a method. The method includes creating partitions for a plurality of clocks of a circuit design, legalizing the partitions using a processor according to a number of clocks in each partition and assignment of clock distribution tracks, and selecting roots for implementing clock trees of the clocks within the partitions.

In one aspect, creating the partitions may include expanding the partitions to a rectangular shape including a source of the clock. In another aspect, creating the partitions may include resolving partition contention for a locked clock source by reducing a size of a first partition overlapping a selected clock region of a second partition to exclude the selected clock region and relocating clock loads of the first partition within the first partition of reduced size.

Legalizing the partitions may include legalizing the partitions according to number of clocks by reducing a size of a selected partition covering a selected clock region comprising a number of clocks exceeding a capacity of the selected clock region to exclude the selected clock region and relocating clock loads of the selected partition out of the selected clock region and into the selected partition of reduced size.

Reducing the size of the selected partition may include selecting a largest shape from a plurality of candidate shapes for the selected partition that has reduced size and that excludes the selected clock region.

In another aspect, legalizing the partitions may include assigning clock distribution tracks to the partitions and determining a maximum size for the partitions.

The features described within this disclosure can be embodied in other forms without departing from the spirit or essential attributes thereof. Accordingly, reference should be made to the following claims, rather than to the foregoing disclosure, as indicating the scope of such features and implementations.

What is claimed is:

1. A method, comprising:
creating, using a processor, partitions for a plurality of clocks of a circuit design for an integrated circuit;
wherein the integrated circuit comprises clock regions organized in a grid and wherein a selected partition comprises a plurality of the clock regions including a congested clock region comprising a number of assigned clocks exceeding a capacity of the congested clock region;
legalizing the selected partition using the processor by resizing the selected partition to exclude the congested clock region and relocating a clock source and clock loads of the clock source of the selected partition out of the congested clock region and into the resized partition;
selecting roots for implementing clock trees of the clocks within the partitions; and
routing the plurality of clocks by assigning clock distribution tracks to the plurality of clocks according to the roots.

2. The method of claim 1, wherein creating the partitions comprises expanding the partitions to a rectangular shape including a source of the clock.

3. The method of claim 1, wherein creating the partitions comprises:
resolving partition contention for a locked clock source by reducing a size of a first partition overlapping a selected clock region of a second partition to exclude the selected clock region; and
relocating clock loads of the first partition within the first partition of reduced size.

4. The method of claim 1, wherein resizing the selected partition comprises:
reducing a size of the selected partition.

5. The method of claim 4, wherein reducing the size of the selected partition comprises selecting a largest shape from a plurality of candidate shapes for the selected partition that has reduced size and that excludes the selected clock region.

6. The method of claim 1, wherein legalizing the partitions comprises:
assigning clock distribution tracks to the partitions; and
determining a maximum size for the partitions.

7. The method of claim 1, wherein:
the selected root is a different node of an integrated circuit from a clock source for a clock; and
the method further comprises assigning a clock routing track to the clock.

8. A system, comprising:
a processor programmed to initiate executable operations comprising:
creating partitions for a plurality of clocks of a circuit design for an integrated circuit;
wherein the integrated circuit comprises clock regions organized in a grid and wherein a selected partition comprises a plurality of the clock regions including a congested clock region comprising a number of assigned clocks exceeding a capacity of the congested clock region;
legalizing the selected partition by resizing the selected partition to exclude the congested clock region and relocating a clock source and clock loads of the clock source of the selected partition out of the congested clock region and into the resized partition;
selecting roots for implementing clock trees of the clocks within the partitions; and
routing the plurality of clocks by assigning clock distribution tracks to the plurality of clocks according to the roots.

9. The system of claim 8, wherein creating the partitions comprises expanding the partitions to a rectangular shape including a source of the clock.

10. The system of claim 8, wherein creating the partitions comprises:
resolving partition contention for a locked clock source by reducing a size of a first partition overlapping a selected clock region of a second partition to exclude the selected clock region; and
relocating clock loads of the first partition within the first partition of reduced size.

11. The system of claim 8, wherein resizing the selected partition comprises:
reducing a size of the selected partition.

12. The system of claim 11, wherein reducing the size of the selected partition comprises selecting a largest shape from a plurality of candidate shapes for the selected partition that has reduced size and that excludes the selected clock region.

13. The system of claim 8, wherein legalizing the partitions comprises:
assigning clock distribution tracks to the partitions; and
determining a maximum size for the partitions.

14. The system of claim 8, wherein:
the selected root is a different node of an integrated circuit from a clock source for a clock;
the processor is further programmed to initiate an executable operation comprising assigning a clock routing track to the clock.

15. A non-transitory computer-readable storage medium having instructions stored thereon which, when executed by a processor, perform a method comprising:
creating, using the processor, partitions for a plurality of clocks of a circuit design for an integrated circuit;
wherein the integrated circuit comprises clock regions organized in a grid and wherein a selected partition comprises a plurality of the clock regions including a congested clock region comprising a number of assigned clocks exceeding a capacity of the congested clock region;
legalizing the selected partition using the processor by resizing the selected partition to exclude the congested clock region and relocating a clock source and clock loads of the clock source of the selected partition out of the congested clock region and into the resized partition;
selecting roots for implementing clock trees of the clocks within the partitions; and
routing the plurality of clocks by assigning clock distribution tracks to the plurality of clocks according to the roots.

16. The non-transitory computer-readable storage medium of claim 15, wherein creating the partitions comprises expanding the partitions to a rectangular shape including a source of the clock.

17. The non-transitory computer-readable storage medium of claim 15, wherein creating the partitions comprises:

resolving partition contention for a locked clock source by reducing a size of a first partition overlapping a selected clock region of a second partition to exclude the selected clock region; and relocating clock loads of the first partition within the first partition of reduced size.

18. The non-transitory computer-readable storage medium of claim 15, wherein resizing the selected partition comprises:

reducing a size of the selected partition.

19. The non-transitory computer-readable storage medium of claim 18, wherein reducing a size of a selected partition comprises selecting a largest shape from a plurality of candidate shapes for the selected partition that has reduced size and that excludes the selected clock region.

20. The non-transitory computer-readable storage medium of claim 15, wherein legalizing the partitions comprises:

assigning clock distribution tracks to the partitions; and
determining a maximum size for the partitions.

* * * * *